United States Patent [19]

Rambert

[11] Patent Number: 4,751,408

[45] Date of Patent: Jun. 14, 1988

[54] VOLTAGE-SWITCHING DEVICE

[75] Inventor: Bernard Rambert, Chatillon Sous Bagneux, France

[73] Assignee: Thomson-CSF, Paris, France

[21] Appl. No.: 900,484

[22] Filed: Aug. 26, 1986

[30] Foreign Application Priority Data

Sep. 6, 1985 [FR] France .............................. 85 13278

[51] Int. Cl.⁴ ........................................... H03K 17/60
[52] U.S. Cl. ................................... 307/571; 307/574; 307/575; 307/577; 307/583; 307/584; 307/254
[58] Field of Search ............... 307/570, 571, 574, 575, 307/577, 583, 584, 254; 361/58, 126, 127

[56] References Cited

U.S. PATENT DOCUMENTS 4,367,421 1/1983 Baker .................................... 307/570
4,394,590 7/1983 Honda .................................. 307/571

FOREIGN PATENT DOCUMENTS

| 48758 | 7/1982 | European Pat. Off. . |
| 2431006 | 8/1976 | Fed. Rep. of Germany . |
| 3229426 | 2/1984 | Fed. Rep. of Germany ...... 307/584 |
| 0210026 | 10/1985 | Japan ................................... 307/571 |
| 2109184 | 5/1983 | United Kingdom . |
| 1035800 | 8/1983 | U.S.S.R. ............................... 307/571 |

Primary Examiner—Stanley D. Miller
Assistant Examiner—Trong Q. Phan
Attorney, Agent, or Firm—Pollock, VandeSande & Priddy

[57] ABSTRACT

In a voltage-switching device for such applications as the control of electron tube grids in the field of radar or telecommunications, the total voltages to be switched are distributed at the terminals of a series-connected array of MOS field-effect transistors, thereby ensuring that each individual transistor is not liable to carry voltages in excess of such values which could result in transistor damage or destruction.

10 Claims, 7 Drawing Sheets

VOLTAGE-SWITCHING DEVICE

BACKGROUND OF THE INVENTION

1. Field of the Invention

The invention is primarily directed to a voltage-switching device.

2. Description of the Prior Art

The device in accordance with the present invention permits rapid voltage switching. In order to switch high voltages, the device in accordance with the invention makes use of insulated-gate field-effect transistors which will hereinafter be designated as MOS transistors. Currently available MOS transistors are not capable of switching voltages higher than 1000 V without damage. In order to switch higher voltages typically within the range of 1000 to 3000 V, it is essential to ensure that each series-connected transistor does not have to withstand voltages which are in excess of ultimate values and are therefore liable to result in damage to the transistor.

The device in accordance with the present invention achieves a static and dynamic distribution of voltages in order to be capable of operating without any attendant danger of damage or destruction. The use of MOS transistors makes it possible to limit the electric power consumption on completion of the switching operation.

The device in accordance with the present invention is practically aperiodic or in other words displays very low response to the prior state. The device is thus capable of attaining high switching frequencies and may accordingly be employed for voltage switching to the grids of electron tubes such as traveling-wave tubes or klystrons. Similarly, the switching speed also permits a high repetition frequency. For example, in the case of switching times within a range of 0.8 $\mu$s to 40 $\mu$s, repetition frequencies within a range of 0 to 50 kHz are obtained.

The device in accordance with the present invention has an advantage in that its construction does not call for sorted components. This is permitted by dynamic balancing of voltages in the different series-connected MOS transistors.

SUMMARY OF THE INVENTION

The main object of the invention is to provide a modular voltage-switching element which is distinguished by the fact that it has a first input and a first output connected in parallel through a forward-biased diode, a resistor, a capacitor and a resistor connected in series, and a second input connected to the source of an insulated-gate field-effect power transistor, a second output connected to the drain of said transistor, said first input being connected to the gate of said transistor.

BRIEF DESCRIPTION OF THE DRAWINGS

Other features of the invention will be more apparent to those versed in the art upon consideration of the following description and accompanying drawings, wherein:

In FIGS. 1 to 16, the same references serve to designate the same elements.

DESCRIPTION OF THE PREFERRED EMBODIMENTS

Figure 1:
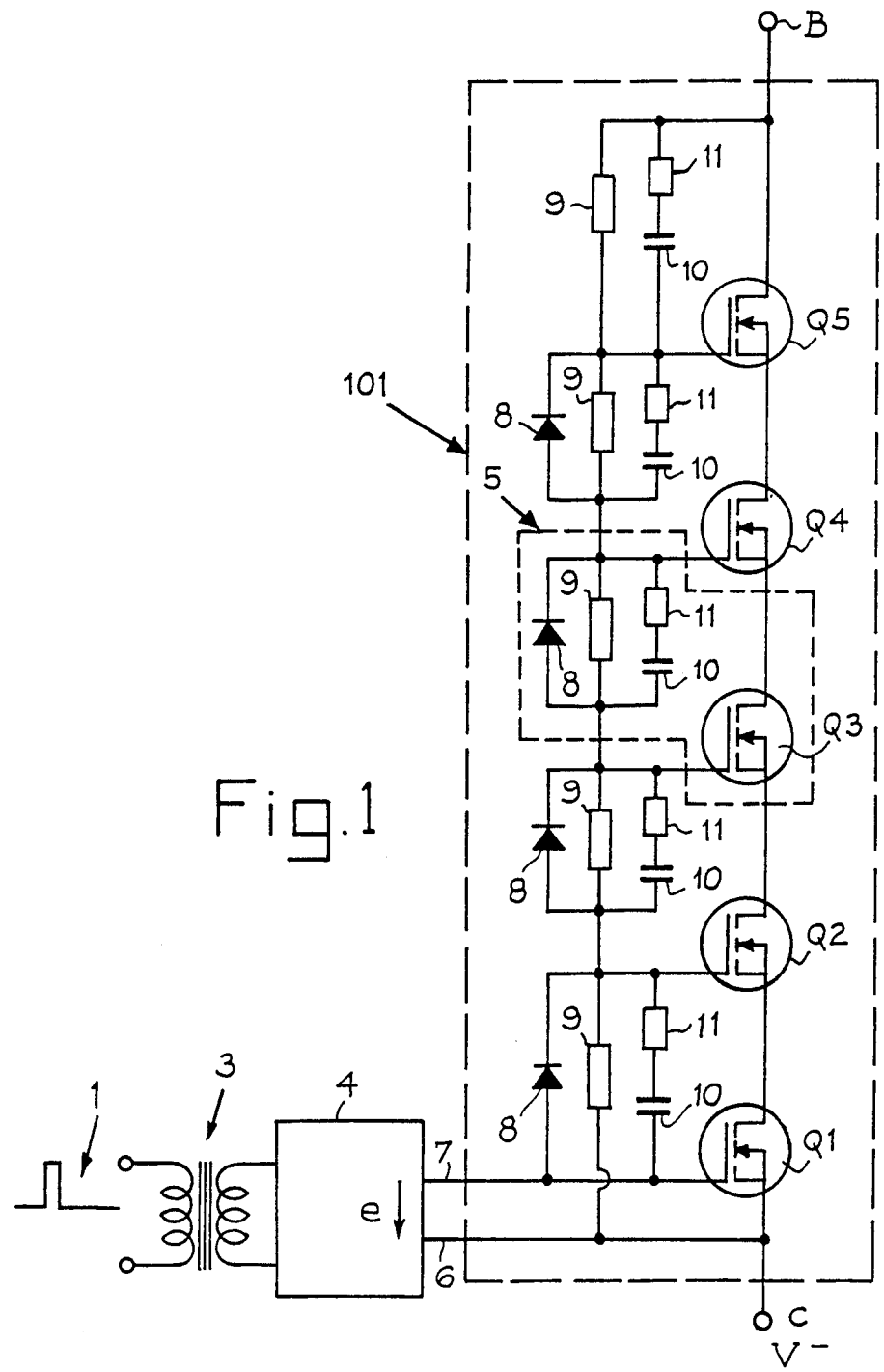
FIG. 1 is a diagram of a first example of the device in accordance with the invention.

In FIG. 1, there is shown one example of construction of a switching unit 101 for canceling the potential difference between two points B and C. This circuit arrangement has the following distinctive features:

the circuit is normally-off with a possibility of turn-on during very short time intervals such as 10 ns, for example, and a low cylindrical factor;

the circuit carries a very low voltage in the normally-off or quiescent state but is capable of carrying an abrupt high voltage without being switched into conduction;

when the circuit is triggered into conduction by a drive pulse, it reverts naturally to its non-conducting state without any additional drive pulse.

Drive pulses 1 are applied to the switching unit 101 by a storage device 4 via an insulating transformer 3.

In order to maintain the waveform of the pulses 1, it is an advantage to make use of a transformer 3 which is designed in the form of a transmission-line structure. By way of example, a coaxial cable can be employed for the winding of said transformer 3.

The storage device 4 is connected to the first stage of the switching unit 101 via the lines 6 and 7. In the example illustrated, the switching unit has five stages. The line 7 is connected to the gate of an MOS transistor Q1, to the input of a diode 8 and of a capacitor 10. The line 6 is connected to the input of a resistor 9, to the source of the transistor Q1 as well as to the point C which is brought to the negative potential V−. The function of the switching unit 101 is to bring the point B to the potential V− by means of a control signal drive pulse 1. The capacitor 10 is connected to a resistor 11. The outputs of the diode 8, of the resistors 9 and 11 are connected to each other and connected on the one hand to the inputs of the same elements of the following stage and on the other hand to the gate of the transistor Q2 which forms part of the second stage. The drain of transistor Q1 is connected to the source of transistor Q2.

The connections described in the foregoing are repeated up to the last stage 5, namely the fifth stage in the example under consideration. The fifth stage is not provided with a diode 8. The output of resistors 9 and 11 as well as the drain of transistor Q5 are connected to the point B.

During normal operation, the device illustrated in FIG. 1 is constituted by balanced bridges of capacitors and resistors which distribute the voltages at the terminals of the transistors Q1 to Q5 in the cut-off state. Should leakage occur in one of the transistors Q1 to Q5, a potential difference will accordingly be established between the gate and the source of the transistor of the following stage, thus enhancing its cut-off condition.

Figure 2:
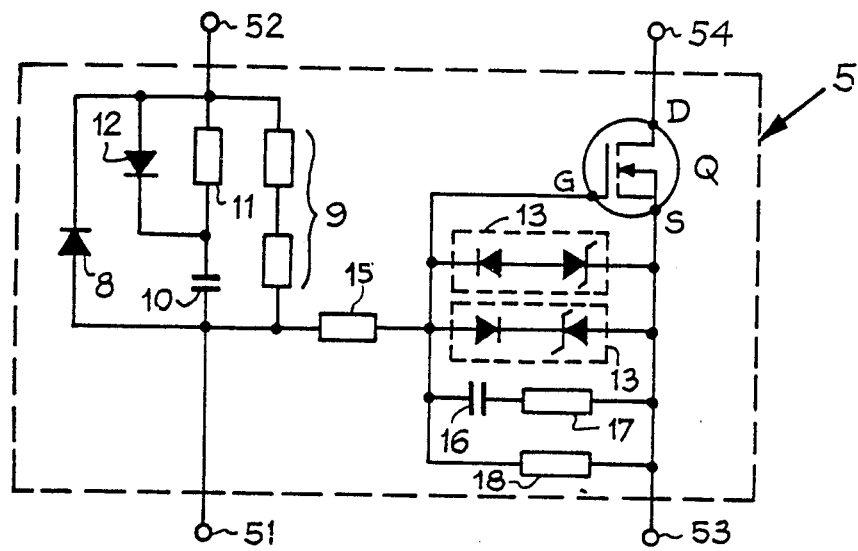
FIG. 2 is a diagram of a detail of the device illustrated in FIG. 1.

In FIG. 2, there is shown one example of construction of an optimized stage 5 of the switching unit 101 of FIG. 1. One input 51 of the stage 5 is connected to a high-speed diode 8, to a capacitor 10 and to two series-connected resistors 9. The capacitor 10 is connected to the resistor 11. The outputs of the resistors 9, of the resistor 11 and of the diode 8 are connected on the one hand to the input of a diode 12 and on the other hand to the output 52 of the stage 5. The output of the diode 12 is connected to the lead which extends from the capacitor 10 to the resistor 11. One input 53 of the stage 5 is connected to a resistor 18, to a resistor 17, to two low-capacitance transils 13 placed in parallel and each biased in a different direction, as well as to the source of transistor Q. The resistor 17 is connected to a capacitor 16. The outputs of the resistor 18, of the capacitor 16, of the two transils 13 are connected on the one hand to a resistor 15 and on the other hand to the gate of the MOS transistor Q. The resistor 15 is connected to the input 51 of the stage 5. The drain of transistor Q is connected to the output 54 of stage 5. In one example of construction, the following values are used for the components of one stage 5:

diodes 8 and 12: high-speed diodes;
capacitor 10: 470 pF;
resistor 9: 2×150 kΩ, 0.5 W;
resistor 15: 22Ω;
resistor 18: 10 kΩ;
capacitor 16: 1 nF;
resistor 17: 4.7Ω (the transils have low capacitance);
transistor Q: MOS transistor IRF 420.

The design function of the resistor 11 is to distribute the charges injected into the gate of transistors Q of the different stages 5 at the moment of switching of the unit into conduction. The value of said resistor is variable with the stages. In the case of the values of the components described in the foregoing, one example of construction having six stages is provided with a resistor 11 of 15Ω for the second stage, of 33Ω for the third stage, of 68Ω for the fourth stage, of 150Ω for the fifth stage. In this example of construction, the first stage is not provided with a resistor 11.

Figure 3:
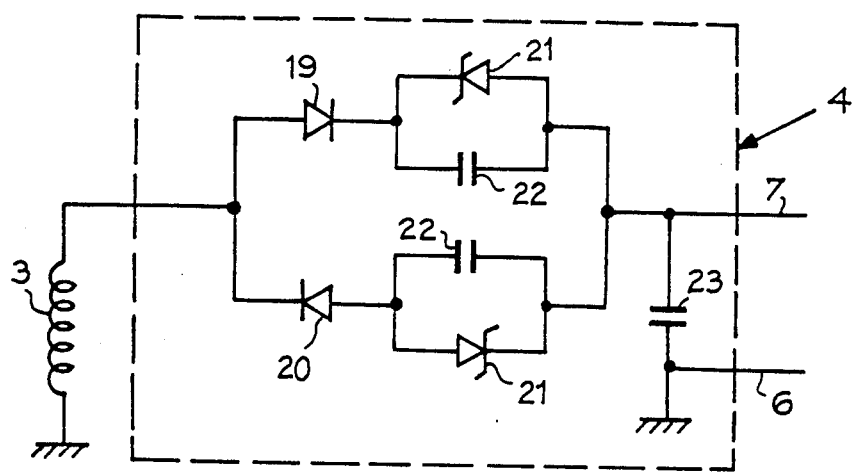
FIG. 3 is a diagram of a detail of the device illustrated in FIG. 1.

In FIG. 3, there is shown one example of construction of the electric signal storage device 4. The input of device 4 is connected to the secondary winding of transformer 3. The input of device 4 is connected in parallel to two threshold circuits each provided with a diode 19 mounted in top-to-tail relation with a Zener diode 21. The two threshold circuits have reverse polarities. Since the Zener diodes are incapable of transmitting pulses, a capacitor 22 is connected in parallel with each Zener diode 21. The output of the threshold circuits is connected on the one hand to the line 7 and on the other hand to the line 6 and to ground through a capacitor 23.

When a pulse having a voltage of higher value than that of the Zener diode 21 is sent to the input of device 4, a current charges the capacitor 23. Said capacitor 23 has a tendency to discharge naturally into the transformer 3. Discharge of the capacitor 23 stops as and when the voltage at the terminals of said capacitor attains the value of the Zener voltage of the diodes 21. In the example illustrated, the device 4 includes threshold circuits for permitting storage of the voltages of both the positive pulses and the negative pulses.

Figure 4:
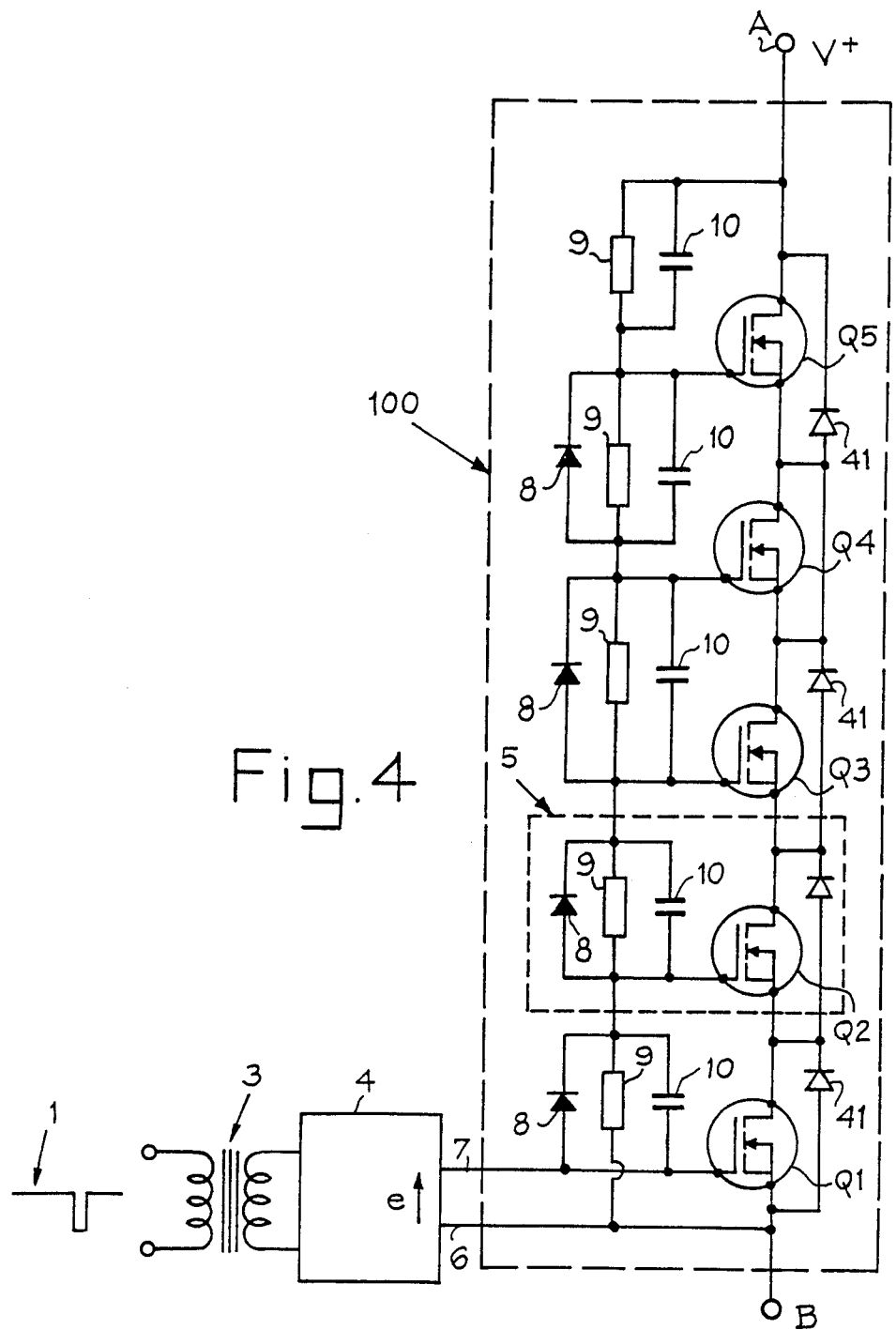
FIG. 4 is a diagram of a second alternative embodiment of the device in accordance with the invention.

In FIG. 4, there is shown a second example of construction of the switching circuit in accordance with the invention. This circuit arrangement offers the following distinctive features:

the circuit is normally-off and carries the full voltage to be switched;

when said circuit is triggered into conduction by a drive pulse, it memorizes its conducting state (on condition that the maximum conduction period of the circuit is not exceeded);

the circuit can be re-triggered into its original non-conducting state by a drive pulse.

The example illustrated in FIG. 4 makes provision for five stages. The input of the switching unit 100 is connected to two lines 6 and 7. The line 7 is connected to the input of a diode 8 and of a capacitor 10 as well as to the gate of transistor Q1. The line 6 is connected to the input of a resistor 9 and to the source of transistor Q1. The outputs of the resistor 9, of the capacitor 10 and of the diode 8 are connected to each other and to the inputs of the diode 8, the resistor 9 and the capacitor 10 of the following stages 5. The drain of transistor Q1 is connected to the source of transistor Q2. The outputs of the diode 8 of the resistor 9 and of the capacitor 10 of the first stage are connected to the gate of transistor Q2.

As an advantageous feature, a diode 41 is placed between the source and the drain of each transistor Q1 to Q5. The output of the fifth stage of the device in accordance with the invention is connected to the point A which is brought to a positive potential V+. The input line 6 of the switching unit 100 is connected to the point B which it is desired to bring to the potential V+.

The value of the capacitors 10 follows an arithmetical progression from the stages of highest order to the stages of lowest order. The common difference of the series is equal to the parasitic gate-source charge of the transistors Q employed. In fact, the capacitor 10 which forms part of the first stage of the switching unit 100 must be capable of charging the parasitic gate-source capacitor of four transistors: Q2, Q3, Q4 and Q5. On the other hand, it will only be necessary by way of example for the capacitor 10 of the third stage 5 of the switching unit 100 to charge the parasitic capacitor of the transistors Q4 and Q5. The capacitor 10 of the last stage can have a capacitance of 470 pF, for example.

Figure 5:
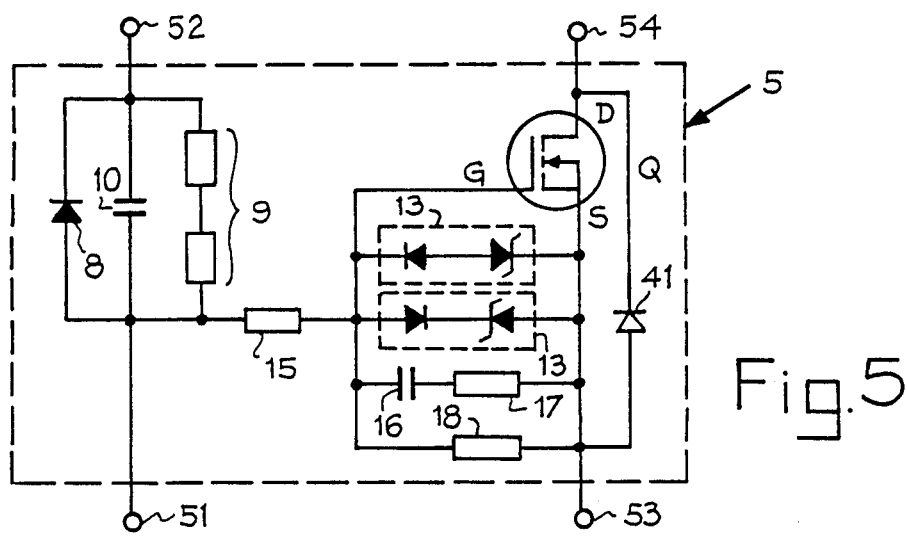
FIG. 5 is a diagram of a detail of the device illustrated in FIG. 4.

FIG. 5 shows one stage of the switching unit 100. A first input 51 is connected to the input of the diode 8, of the capacitor 10, of the resistors 9 and of the resistor 15. The outputs of the diode 8, of the capacitor 10 and of the resistors 9 are connected to the output 52 of stage 5. The input 53 of stage 5 is connected to the input of the resistor 18, of the resistor 17, of the diode 41, of two transils 13 and of the source of transistor Q. The output of the resistor 17 is connected to the capacitor 16. The outputs of the resistor 18, of the capacitor 16, of two transils 13 are connected on the one hand to the resistor 15 and on the other hand to the gate of transistor Q. The output of the diode 41 is connected to the drain of transistor Q. Said drain of transistor Q is connected to the output 54 of stage 5.

The outputs 52 and 54 of one stage 5 are connected respectively to the inputs 51 and 53 of the following stage 5.

Figure 6:
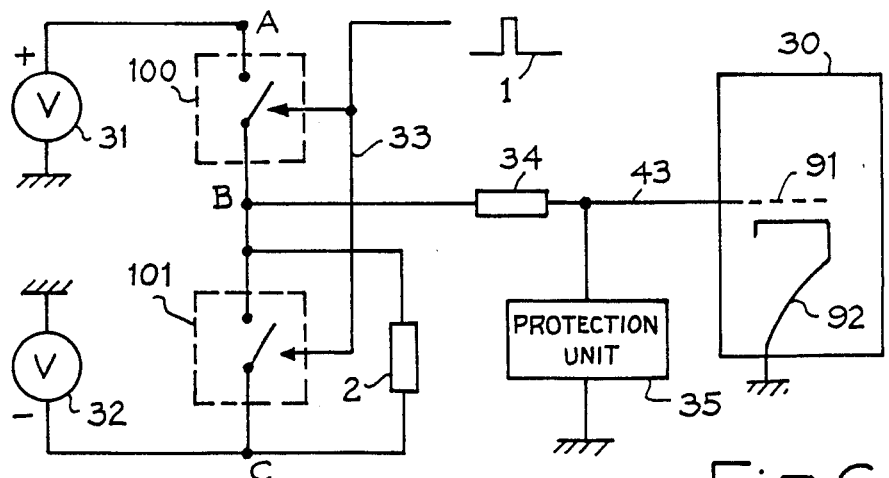
FIG. 6 is a diagram of a device in accordance with the invention for the practical application of the device of FIGS. 1 to 4.

FIG. 6 illustrates a voltage-switching device for controlling an electron tube 30 via a grid 91. The electron stream emitted by the cathode 92 is a function of the voltage applied to the grid 91. The quantities of energy required in order to bring the grid 91 to a high voltage are of small value.

Figure 7:
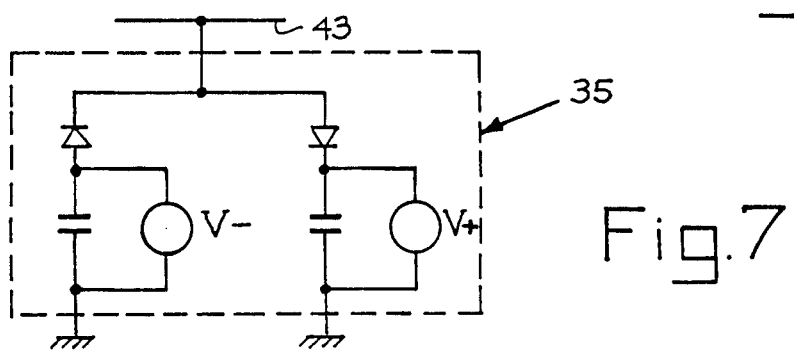
FIG. 7 is a diagram of a detail of the device illustrated in FIG. 6.

The device of FIG. 6 includes a negative voltage generator 32 which is connected in parallel to a bias resistor 2 and to a switching unit 101 as illustrated in FIG. 1. In addition, the device of FIG. 6 includes a positive voltage generator 31 connected to a switching unit 100 of FIG. 4. The outputs of the switching units 100 and 101 are connected to a point B. The point B is connected to the grid 91 through a resistor 34 and a line 43. The drive pulses 1 are transmitted to the switching units 100 and 101 via a line 33 and via a transformer 3 (not shown in the drawings). It is advantageous to connect the switching units 100 and 101 to a single transformer which has two secondary circuits. It is also an advantage to connect a single storage device 4 to the two switching units 100 and 101. In accordance with another advantageous arrangement, the device is provided with a protection unit 35 for grounding the line 43 which controls the grid 91 in the event of arc formation within the electron tube 30. In a first example of construction, the protection unit 35 is provided with a spark-gap. The disadvantage of the protection unit lies in the fact that it behaves as a short-circuit as long as it has not been released. The function of the protection unit 35 can advantageously be performed by a limiter. A device of this type is illustrated in FIG. 7.

In the quiescent state, the switching units 100 and 101 are open, the grid is brought to the potential V— by means of the bias resistor 2, the voltage (V+)−(V−) is carried by the switching unit 100. The control voltage of said switching unit 100 is equal to zero. All the transistors are in the nonconducting state and the voltage V+ −V− is distributed between said transistors as a function of the potentiometric ratios of the resistor bridge 11. The control voltage of the switching unit 101 is equal to zero and all the transistors Q are cut-off but their terminal voltage is maintained at zero by means of the bias resistor 2. The potential difference between the point B and the point C of the circuit is practically zero.

When the "on" state of the array is established, the point B is brought to the potential V+. The switch 100 is closed while the switch 101 is open. The grid is brought to the potential V+ through the low-value protection resistor 34. The voltage (V+)−(V−) is carried by the switch 101. At this moment, the control voltage of the switch 101 is equal to −10 V. Transistor Q1 is maintained in the nonconducting state by the control voltage. The point B changes-over to the voltage V+. The series of RC networks behaves as a balanced dividing bridge and ensures staging of the gate voltage of the MOS transistors. These transistors produce action as a function of their gate-source voltage in order to ensure that the difference in voltages between the points B and C is distributed between said transistors. The control voltage of the switching unit 100 is equal to +10 V. Transistor Q1 is switched into conduction and causes discharge of the capacitor 10 of the first stage towards the gate of transistor Q2 which in turn changes to the conducting state. The process of transition to the conducting state thus continues in sequence up to the transistor Q5. The diodes 41 serve to produce locally enhanced action on the control of gates which are deficient.

When the "off" state of arrays is established, the switch 100 is open while the switch 101 is closed. The grid 91 is brought to a potential V— by means of the protection resistor 34. After a few microseconds, the switch 101 automatically reverts to the open position in order to restore the switch for the grids 91 to the initial state of rest. The switch control voltage is equal to +10 V, the transistor Q1 undergoes a transition to the conducting state and discharges its capacitor 10 into the gate of transistor Q2. Said transistor Q2 in turn changes over to the conducting state and causes transistor Q3 to conduct, the process being continued in sequence until all the transistors have changed to the conducting state. The control voltage of the switching unit 100 is equal to −10 V. The point B is brought to the voltage V—. Transistor Q1 is caused to cut-off under the action of the control voltage and causes the entire chain of transistors Q2 to Q5 to revert to the nonconducting state.

In the device according to the invention, the maximum value of switched voltage is equal to the product of the number of transistors times the maximum voltage carried by one transistor. The number of transistors is limited by the time-delay accumulated from one transistor to the next at the time of changes of state. If the number of transistors of type IRF420 exceeds seven, the accumulated time-delay produces overvoltages which impair the performances of the unit to a considerable extent.

In the case of operation at high frequency, it is possible to adopt a switching device involving the use of two switching units 100 as illustrated in FIG. 4. On the other hand, there is no means of controlling a continuous-transmission radar (with a repetition frequency of 0 Hz).

In a first example of construction, the device in accordance with the invention was provided with switching units 100 and 101 each having five transistors. The control voltage amplitude was variable between 0 and 2400 V, the pulse width was variable between 0.8 µs and 40 µs and the recurrence frequency was variable between 0 and 50 kHz. The rise time on a charge of 200 pF was equal to 100 ns. In the case of a device provided with switching units 100 and 101 each having six transistors, the maximum voltage obtained in continuous operation was 2800 V.

FIGS. 8 to 16 illustrate the performances of the device in accordance with the invention. These diagrams are copies of oscilloscope screen displays representing the response of a voltage as a function of time.

Figure 8:
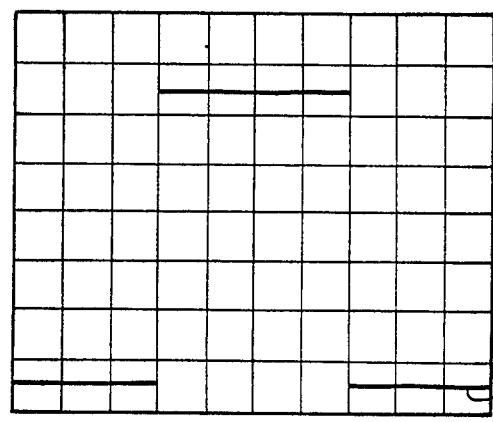
FIGS. 8 to 16 are curves illustrating the performance obtained by means of the device in accordance with the invention.

In FIG. 8, the curve 85 illustrates a function v=f(t) representing the variation in voltage with time. The curve of FIG. 8 corresponds to switching units 100 and 101 each provided with six transistors for switching voltages of +1000 V to −800 V to a grid having a capacitance of 250 pF. The scale of FIG. 8 corresponds to 500 V per vertical division and 1 µs per horizontal division.

Figure 9:
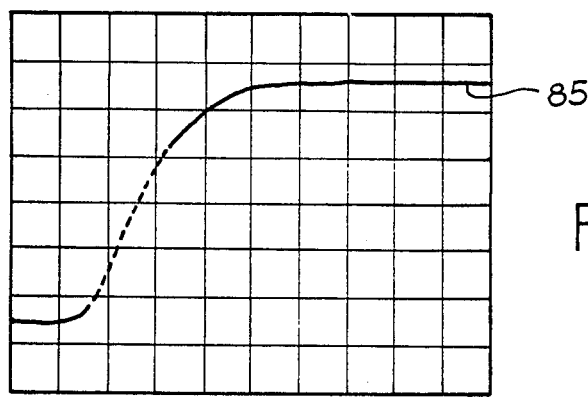

In FIG. 9, there is shown a curve 85 which illustrates the rise time of a six-transistor switching unit for charging a grid having a capacitance of 250 pF. In FIG. 9, one horizontal division corresponds to 50 ns.

Figure 10:
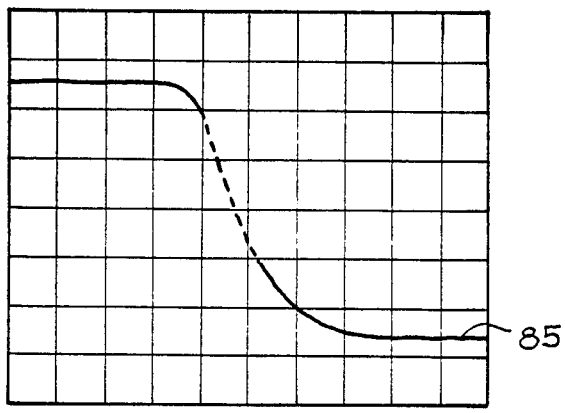

In FIG. 10, a curve 85 represents the fall time of the device in accordance with the invention as employed for plotting the curves of FIGS. 8 and 9.

FIGS. 11 to 16 illustrate the temperature stability of the device in accordance with the invention. These figures are based on the use of five-transistor switching units 100 and/or 101 for switching a voltage difference of 2000 V to a grid having a capacitance of 150 pF. One horizontal division corresponds to 20 ns.

Figure 11:
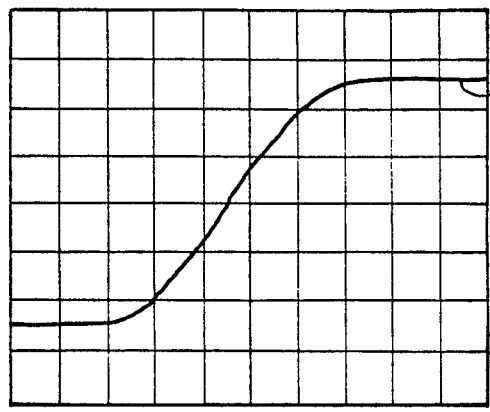
Figure 14:
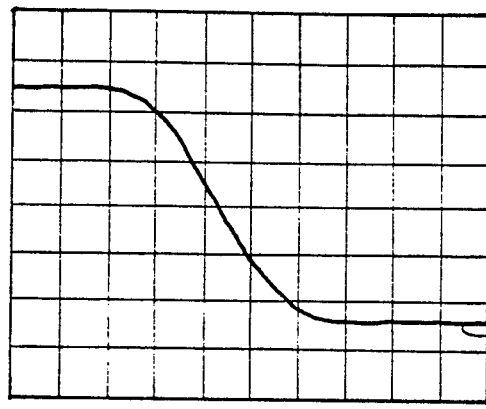

The curve 85 of FIGS. 11 and 14 respectively illustrates the rise time and fall time at a temperature of 233 K.

Figure 12:
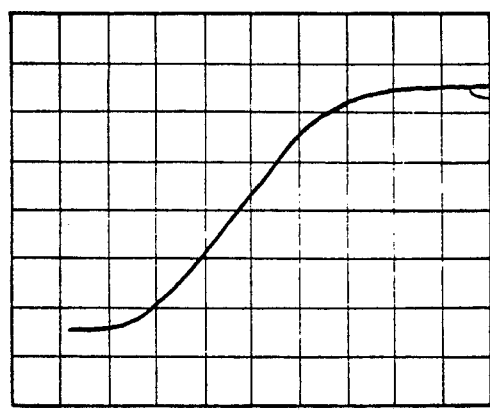
Figure 15:
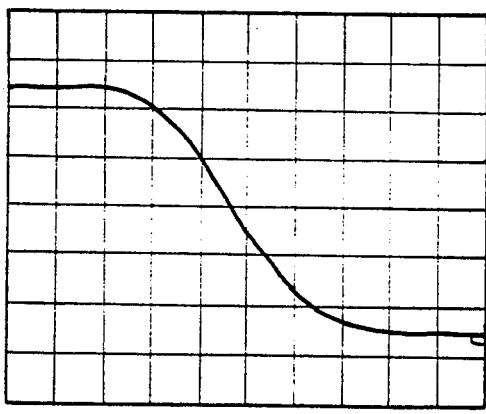

The curve 85 of FIGS. 12 and 15 illustrates respectively the rise time and fall time at a temperature of 300 K.

Figure 13:
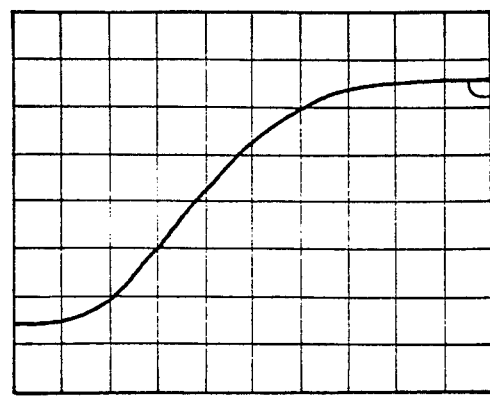
Figure 16:
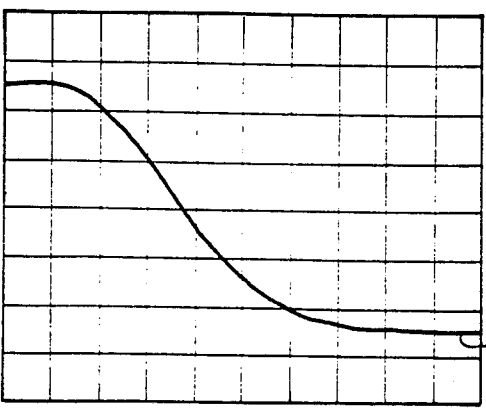

The curve 85 of FIGS. 13 and 16 illustrates the rise time and fall time at a temperature of 353 K.

The invention is primarily applicable to switching of grid-controlled electron tubes, especially for radar systems and telecommunications.

What is claimed is:

1. A voltage-switching element, wherein said voltage-switching element has a first input and a first output connected in parallel through a forward-biased diode, a resistor, a capacitor and a resistor connected in series, and a second input connected to the source of an insulated-gate field-effect (MOSFET) power transistor, a second output connected to the drain of said insulated-gate field-effect (MOSFET) power transistor, said first input being connected to the gate of said insulated-gate field-effect (MOSFET) power transistor.

2. A voltage-switching element, wherein said voltage-switching element has a first input and a first output connected in parallel through a forward-biased diode, a resistor and a capacitor, a second input connected to the source of an insulated-gate field-effect (MOSFET) power transistor, a second output connected to the drain of said insulated-gate field-effect (MOSFET) power transistor, said first input being connected to the gate of said insulated-gate field-effect (MOSFET) power transistor.

3. A voltage-switching element according to claim 1, wherein said voltage-switching element further comprises a diode connected between a lead extending from the capacitor to the series-connected resistor and the first output, said diode being reverse-biased.

4. A voltage-switching element according to claim 1 wherein said voltage switching element further comprises a low-value resistor placed between said gate of said insulated-gate field-effect (MOSFET) power transistor and said first input.

5. A voltage-switching element according to claim 1, wherein two oppositely-biased transils, a resistor and a further resistor placed in series with a capacitor are mounted in parallel between the gate and the source of the insulated-gate field-effect (MOSFET) power transistor.

6. A voltage-switching element according to claim 2, wherein the source and the drain of the insulated-gate field-effect (MOSFET) power transistor are connected through a forwrd-biased diode.

7. A device according to claim 6, wherein the capacitance of the capacitors follows an arithmetical progression having a common difference equal to the value of the parasitic gate-source capacitances of the insulated-gate field-effect (MOSFET) power transistors.

8. A voltage-switching element according to claim 6, wherein said voltage-switching element further includes voltage storage means including a diode and a capacitor which can be charged through said diode, said diode being mounted in top-to-tail relation with a Zener diode to form a diode assembly.

9. A voltage-switching element according to claim 8, wherein a further capacitor is connected to the terminals of the Zener diode.

10. A voltage switching element according to claim 8, wherein said voltage storage means comprises two diode assemblies of opposite polarity, a Zener diode being employed for storing the negative voltages and the positive voltages.

* * * * *